United States Patent [19]

Shah et al.

[11] Patent Number: 4,915,907
[45] Date of Patent: Apr. 10, 1990

[54] SINGLE CRYSTAL ARTICLES HAVING REDUCED ANISOTROPY

[75] Inventors: Dilip M. Shah, Glastonbury; David N. Duhl, Newington, both of Conn.

[73] Assignee: United Technologies Corporation, Hartord, Conn.

[21] Appl. No.: 144,767

[22] Filed: Jan. 19, 1988

Related U.S. Application Data

[63] Continuation of Ser. No. 847,972, Apr. 3, 1986, abandoned.

[51] Int. Cl.$^4$ ............................................. C22C 19/05
[52] U.S. Cl. ................................... 420/448; 148/404; 420/449
[58] Field of Search ................. 148/404; 420/448, 449

[56] References Cited

U.S. PATENT DOCUMENTS

| | | | |
|---|---|---|---|
| 3,494,709 | 2/1970 | Piearcey | 416/232 |
| 3,567,526 | 3/1971 | Gell et al. | 148/32.5 |
| 3,700,433 | 10/1972 | Duhl | 148/32.5 |
| 3,711,337 | 1/1973 | Sullivan et al. | 148/32.5 |
| 3,832,167 | 8/1974 | Ker Shaw et al. | 75/170 |
| 4,078,951 | 3/1978 | Denzine et al. | 148/32.5 |
| 4,169,742 | 10/1979 | Wukusick et al. | 148/32.5 |
| 4,209,348 | 6/1980 | Duhl et al. | 148/3 |
| 4,289,570 | 9/1981 | Terkelsen | 164/122.1 |
| 4,402,772 | 9/1983 | Duhl et al. | 148/404 |
| 4,459,160 | 7/1984 | Meetham et al. | 148/3 |
| 4,488,915 | 12/1984 | Hill et al. | 148/404 |

*Primary Examiner*—R. Dean
*Attorney, Agent, or Firm*—James M. Rashid

[57] ABSTRACT

The anisotropy typically observed in single crystal nickel base superalloys is reduced by intentionally adding certain small amounts of carbon, boron, zirconium or hafnium, either individually or in combination, to the alloy composition.

5 Claims, No Drawings

SINGLE CRYSTAL ARTICLES HAVING REDUCED ANISOTROPY

This application is a file wrapper continuation of application Ser. No. 847,972 filed Apr. 3, 1986, abandoned.

TECHNICAL FIELD

This invention relates to single crystal articles. More particularly, it relates to low anisotropy single crystal articles useful as airfoils in gas turbine engines.

BACKGROUND ART

It is generally accepted that blades and vanes in the turbine section of modern gas turbine engines operate in one of the most severe environments in the engine. As a result, various processes and alloy compositions have specifically been developed to fabricate such components.

Today, turbine section blades and vanes are typically fabricated by investment casting techniques; three techniques have been found to be particularly useful, and each produces a particular grain structure. The structure produced using conventional casting techniques is characterized by generally equiaxed, randomly oriented grains. The two other useful investment casting techniques are types of directional solidification (DS); in one such technique, the cast component is characterized by a multiplicity of substantially parallel (columnar) grains. In the other technique, the cast component is a single crystal, i.e., contains only one grain.

Components produced using conventional casting techniques have mechanical properties which are generally equivalent irrespective of the direction in which they are measured. The mechanical properties of DS components are, however, dependent upon the direction in which they are measured, i.e., these components are anisotropic. For example, the room temperature modulus of elasticity (tensile stress per unit strain in the elastic regime) for directionally solidified nickel base superalloys of the type typically used in gas turbine engines is about $18 \times 10^6$ psi in the <100> direction; about $33 \times 10^6$ psi in the <110> direction; and about $46 \times 10^6$ in the <111> direction.

Due to recent trends towards very high gas stream temperatures in the turbine section, resistance to thermal fatigue cracking has become the life limiting property for some single crystal airfoils (blades and vanes). Because a low modulus of elasticity is generally indicative of good thermal fatigue cracking resistance, single crystal castings are fabricated such that the low modulus [001] axis is substantially aligned with the primary stress axis of the part. In general, the primary stress axis lies on the longitudinal axis of the part. According to U.S. Pat. No. 3,494,709, the angle between the [001] crystal axis and the longitudinal axis of a gas turbine engine airfoil should be less than 20°. In some currently used single crystal airfoils, this angle is no greater than 15°.

As noted above, specific alloy compositions have been developed for turbine components such that castings made of the alloys exhibit desirable properties. However, alloys which have useful properties when conventionally cast or when cast into columnar grain form may not have equally useful properties when cast into single crystal form. This is generally attributed to the fact that articles having a conventional or columnar grain microstructure generally require grain boundary strengthening elements for the necessary strength at high temperatures. Such elements include carbon, boron, zirconium, and hafnium, as described in U.S. Pat. Nos. 3,567,526, 3,700,433, 3,711,337, 3,832,167, 4,078,951 and 4,169,742. Single crystal articles have no internal grain boundaries, and as discussed in U.S. Pat. Nos. 3,494,709 and 3,567,526, the presence of C, B, Zr, or Hf should be avoided. These patents teach that boron and zirconium impair the properties of single crystals, and that carbon, if present at all, should be limited to 100 parts per million (ppm) in the alloy composition. U.S. Pat. No, 4,209,348 describes a single crystal alloy composition in which no intentional additions of C, B, Zr, or Hf are made, although such elements may be present as impurities. The individual C, B, Zr, and Hf levels should be less than 50 ppm, and the combined C+B+Zr+Hf content should be less than 100 ppm.

U.S. Pat. No. 4,459,160 describes single crystal alloy compositions wherein the C+B+Zr+Hf content may exceed 100 ppm, although no intentional additions of B, Zr or Hf are made. U.S. Pat. No. 4,488,915 describes a single crystal composition which permits no zirconium or boron, but up to 500 ppm carbon. However, it is stated that most of the carbon will transform to carbon monoxide during the casting process, and as a result, the composition of the solidified article will actually contain only a little carbon.

U.S. Pat. No. 4,402,772 describes a single crystal composition which has good oxidation resistance, apparently due, in part, to the presence of about 500 ppm hafnium.

While numerous compositions for single crystal articles exist, they all suffer from anisotropy, which limits their utility. Accordingly, engineers continue to work to develop improved alloy systems, particularly those in which castings made of the alloys have reduced anisotropy. Such alloy compositions would permit, e.g., the use of articles wherein the [001] crystal axis is more than 20° from the primary stress axis of the article.

DISCLOSURE OF THE INVENTION

Objects of the invention include improved single crystal articles, particularly for use in gas turbine engines. The articles should have reduced anisotropy compared to currently used articles.

According to the invention, the anisotropy of single crystal nickel base superalloy articles is reduced by adding one or more of the elements selected from the group consisting of carbon, boron, zirconium, and hafnium. The total C+B+Zr+Hf should be between about 0.002 and 0.500 weight percent (20 and 5,000 ppm). One advantage of the invention is that it permits the use of high modulus articles wherein the [001] crystal axis is greater than about 20° from the longitudinal axis of the article.

The foregoing and other objects, features and advantages of the present invention will become more apparent from the following description of the preferred embodiment.

BEST MODE FOR CARRYING OUT THE INVENTION

As noted in the Background Art section, the elements boron, carbon, zirconium, and hafnium are typically excluded from most single crystal nickel base superalloy compositions. However, it has been discovered that when these elements are intentionally added to single crystal nickel base superalloy compositions in certain amounts, there is a surprising decrease in the anisotropy of these alloys, when compared to the alloys containing no intentional additions of such elements.

To examine the effects of additions of B, C, Zr, and Hf on the mechanical properties of single crystal nickel base superalloy articles, alloys having the following composition, on a weight percent basis, were evaluated: 0-20Co, 3-18Cr, 0-18W, 3-8Al, 0-5Ti, 0-5Cb, 0-15Ta, 0-4Mo, 0-7Re, with the balance nickel. The average composition for the three specific alloys examined was, Alloy A: Ni-5Co-10Cr-16W-5A-1Ti;
Alloy B: Ni-10Co-9Cr-12W-5A-12Ti-1Cb; and
Alloy C: Ni-5Co-10Cr-4W-5Al-1.5Ti-12Ta.

These alloys were cast into single crystal form using techniques well known in the art. See, e.g., the aforementioned U.S. Pat. No. 3,494,709. Alloy B is similar to the well known alloy MAR-M200 which is typically cast into a columnar grain form. However, for the purposes of the tests described below, it was cast into single crystal form. Alloy C is an alloy currently used in the fabrication of gas turbine engine components. The alloy is more fully described in U.S. Pat. No. 4,209,348, and is one of the strongest single crystal nickel base superalloys known to applicants. However, like all prior art superalloys, single crystal castings made of this composition are anisotropic. Mechanical properties in the [001] direction are considerably better than in the [110] or [111] directions, and as a result, castings made of the alloy have their [001] crystal direction aligned within 20° of the primary stress axis.

Tables I-III present the results of tests to determine the effects of additions of C, B, Zr, and Hf to these three alloys. Table I shows that additions of B and Zr markedly reduced the anisotropy generally observed in Alloy A at 1,800° F. under tensile creep conditions. In Table I, "Normalized Anisotropy" for, e.g., the <110> orientation, is calculated by dividing the <110> orientation rupture life by the <100> orientation rupture life. Since the Normalized Anisotropy for the <110> and <111> orientations are higher for the modified alloy than for the unmodified alloy, the modified alloy is more isotropic. This convention is applicable to the data in Tables II and III, as well as to the specification and claims. At an applied stress of 36 ksi, modified Alloy A (i.e., containing 0.013% B and 0.011% Zr) had rupture lives in the <100>, <110>, and <111> directions that were within at least 25% of each other. The rupture lives for unmodified Alloy A in these directions differed by as much as 51%. That the anisotropy is reduced by adding B and Zr is surprising, and nowhere suggested in the prior art. Additionally, the creep rupture life in each direction for the modified alloy was increased compared to the unmodified alloy. This is contrary to U.S. Pat. No. 3,494,709, which teaches that the presence of boron and zirconium decreases the creep rupture life of single crystal nickel base superalloys.

TABLE I

| Tensile rupture life at 1800° F./36 ksi of single crystal Ni—5Co—10Cr—16W—5Al—1Ti (Alloy A) specimens. | | | |
|---|---|---|---|
| Element Additions | Orientation | Rupture Life (hr) | Normalized Anisotropy |
| None* | <100> | 75.8 | 1.00 |
|  | <110> | 36.9 | 0.49 |
|  | <111> | 59.5 | 0.78 |
| 0.013B + | <100> | 108.0 | 1.00 |
|  | <110> | 81.3 | 0.75 |

TABLE I-continued

| Tensile rupture life at 1800° F./36 ksi of single crystal Ni—5Co—10Cr—16W—5Al—1Ti (Alloy A) specimens. | | | |
|---|---|---|---|
| Element Additions | Orientation | Rupture Life (hr) | Normalized Anisotropy |
| 0.011Zr | <111> | 104.8 | 0.97 |

*Unmodified Alloy A

Table II shows that the anisotropy of Alloy B was reduced by additions of carbon, as well as by additions of B+Zr, and C+B+Zr. Additions of B+Zr were most favored, and resulted in the alloy's 0.2% compressive yield stress at 1,100° F., in the directions <100>, <110>, and <111>, being within at least 12% of each other. As is seen, articles having the modified compositions had properties which were generally comparable to or better than those of the unmodified alloy.

TABLE II

| Compressive yield strength (0.02%) of single crystal Ni—10Co—9Cr—12W—5Al—2.0Ti—1Cb (Alloy B) specimens at 1100° F. | | | |
|---|---|---|---|
| Element Additions | Orientation | 0.2% YS (ksi) | Normalized Anisotropy |
| None* | <100> | 130.6 | 1.00 |
|  | <110> | 139.2 | 1.07 |
|  | <111> | 113.4 | 0.87 |
| 0.15c | <100> | 131.0 | 1.00 |
|  | <110> | 147.9 | 1.13 |
|  | <111> | 123.5 | 0.94 |
| 0.15B + 0.05Zr | <100> | 123.8 | 1.00 |
|  | <110> | 138.8 | 1.12 |
|  | <111> | 135.9 | 1.10 |
| 0.15C + 0.015B 0.05Zr | <100> | 114.5 | 1.00 |
|  | <110> | 135.9 | 1.19 |
|  | <111> | 134.2 | 1.17 |

*Unmodified Alloy B

Alloy C was the only material in which the effect of adding hafnium on anisotropy was evaluated. As is seen in Table III, the tensile rupture lives at 1,400° F. in the <110> and <111> directions were significantly enhanced relative to <100> by the addition of 0.38% Hf, even through the <100> rupture life was reduced. Nonetheless, these tests do show that adding Hf reduced the level of anisotropy. Also, even though the <100> life was decreased, it is still within the range which is considered useful for some gas turbine engine components.

TABLE III

| Tensile rupture life of single crystal Ni—5Co—10Cr—4W—5Al—1.5Ti—12Ta (Alloy C) specimens at 1400° F. | | | |
|---|---|---|---|
| Element Additions | Orientation | Rupture Life (hr) | Normalized Anisotropy |
| None* | <100> | 475.0 | 1.00 |
|  | <110> | 45.2 | 0.10 |
|  | <111> | 31.7 | 0.07 |
| 0.38Hf** | <100> | 145.0 | 1.00 |
|  | <110> | 41.8 | 0.29 |
|  | <111> | 73.1 | 0.50 |

*Unmodified Alloy C; tested at 110 ksi
**Tested at 100 ksi

These test results all indicate that additions of C, B, Zr, and Hf provide a desired and unexpected reduction in the anisotropy of nickel base single crystal superalloy articles. Reviewing the rupture life data in Tables I and III, it is seen that the Normalized Anisotropy for modified Alloy A (i.e., containing boron and zirconium) is 53% higher for the <110> orientation and 24% higher for the <111> orientation, as compared to unmodified Alloy A. In other words, modified Alloy A is more isotropic than unmodified Alloy A. A much greater increase is seen when modified Alloy C (containing hafnium) is compared to unmodified Alloy C. On the basis of these tests, to reduce anisotropy, the amount of C+B+Zr+Hf added to nickel base superalloys which are intended for single crystal applications should range between about 0.002 and 0.500 weight percent. Most preferably, the sum total of these elements ranges between 0.01 and 0.08.

The addition of such elements to nickel base superalloys will not adversely affect the oxidation and hot corrosion resistance of castings made of the alloy; it may even be improved compared to the unmodified alloy composition. Similarly, long term stability (i.e., resistance to the precipitation of undesirable metallurgical phases during extended exposure to high temperatures) will not be compromised. The ability to heat treat castings made of these alloys to produce a desired microstructure may be adversely affected, but only to a slight degree.

The anisotropy typically observed in nickel base single crystal turbine airfoils has required that the crystal [001] axis be within about 20° of the longitudinal axis of the component. However, due to the discovery that anisotropy may be reduced by intentionally adding C, B, Zr or Hf, or combinations of these elements, the present invention makes possible the use of single crystal airfoils wherein the angular variance between the component longitudinal axis and the crystal [001] axis is greater than 20°. For example, a crystallographic axis such as <110> or <111> which has a high modulus of elasticity (i.e., greater than about $22 \times 10^6$ psi) may be partially or substantially aligned with the airfoil longitudinal axis, which would provide a stiffer airfoil with desirable resonant frequency characteristics. These airfoils would be most useful in applications which are not thermal fatigue life limited. They could be cast by seeding techniques, as generally described in commonly assigned U.S. Pat. No. 4,289,570.

Although this invention has been shown and described with respect to a preferred embodiment, it will be understood by those skilled in the art that various changes in form and detail thereof may be made without departing from the spirit and scope of the claimed invention.

We claim:

1. A method for modifying the nickel base superalloy composition Ni-5Co-10Cr-4W-5Al-1.5Ti-12Ta such that single crystal castings made therefrom have reduced anisotropy, comprising adding an effective amount of hafnium to the alloy composition.

2. The method of claim 1, comprising the step of adding about 0.38 weight percent hafnium to the alloy composition.

3. A single crystal casting consisting essentially of, by weight percent, Ni-5Co-10Cr-4W-5Al-1.5Ti-12Ta-0.38Hf.

4. The casting of claim 3, having its <100> axis greater than at least about 20° from the article longitudinal axis.

5. A method for modifying the nickel base superalloy composition Ni-5Co-10Cr-16W-5Al-1Ti such that single crystal castings made therefrom having reduced anisotropy, comprising adding about 0.013B and about 0.011Zr to the alloy composition.

* * * * *